United States Patent
Wang et al.

(10) Patent No.: US 7,427,876 B1
(45) Date of Patent: Sep. 23, 2008

(54) REVERSIBLE SEQUENTIAL ELEMENT AND REVERSIBLE SEQUENTIAL CIRCUIT THEREOF

(75) Inventors: Chun Yao Wang, Hsinchu (TW); Min Lun Chuang, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 21 days.

(21) Appl. No.: 11/687,983

(22) Filed: Mar. 19, 2007

(51) Int. Cl.
H03K 19/173 (2006.01)

(52) U.S. Cl. .......................................... 326/46
(58) Field of Classification Search ............... 326/46
See application file for complete search history.

(56) References Cited

U.S. PATENT DOCUMENTS

| 5,357,548 | A * | 10/1994 | Merkle | 377/57 |
| 6,987,402 | B2 * | 1/2006 | Lee et al. | 326/104 |
| 2004/0246028 | A1 * | 12/2004 | Lee et al. | 326/104 |
| 2007/0266347 | A1 * | 11/2007 | Chang et al. | 716/3 |

OTHER PUBLICATIONS

Min-Lun Chuang and CHun-Yao Wang□□Synthesis of reversible sequential elements□□Jan. 2008□□.*
Himanshu Thapliyal and A.P Vinod□□Design of Reversible Sequential Elements with Feasibility of Transistor Implementation□□Jul. 2007□□.*
Gerhard W. Dueck and Dmitri Maslov□□Transformation-based Synthesis of Networks of Toffoli/Fredkin Gates□□Aug. 2003.*
Dmitri Maslov□□Fredkin/Toffoli Templates for reversible logic synthesis□□Nov. 2003□□.*
Dmitri Maslov□□Toffoli Network Synthesis with templates□□Jun. 2005□□.*
Min-Lun Chuang, Chun-Yao Wang□□Synthesis of reversible sequential elements□□Jul. 2007□□Fig. 7, excellent for prior art, however, date does not constitute prior art□□.*
Pallav Gupta□□An Algorithm for synthesis of reversible logic circuits□□Nov. 2006.*
Mayur Bubna, Nitin Goyal, and Indranil Sengupta□□A DFT methodology for detecting bridging faults in reversible logic circuits□□Feb. 2007.*
Dilip P. Vasudevan, Parag K. Lala□□Reversible logic design with online testability□□Apr. 2006.*
Chuang et al., Synthesis of Reversible Sequential Elements, Journal, Jan. 25, 2007, 420-425, National Tsing Hua University, IEEE 12th Asia and South Pacific Design Automation Conference, Taiwan.

* cited by examiner

*Primary Examiner*—Rexford Barnie
*Assistant Examiner*—Thienvu V Tran
(74) *Attorney, Agent, or Firm*—WPAT, PC; Anthony King

(57) ABSTRACT

A reversible sequential element comprises a first logic gate and a second logic gate. The first logic gate includes a first input terminal, a second input terminal, a third input terminal, a first output terminal coupled to the first input terminal, a second output terminal and a third output terminal. The second logic gate includes a first input line, a second input line, a first output line and a second output line. When the first input terminal is set to a first state, the second input terminal is coupled to the third output terminal and the third input terminal is coupled to the second output terminal; otherwise, the second input terminal is coupled to the second output terminal and the third input terminal is coupled to the third output terminal. The third output terminal, second input line and second output line are coupled to each other. The input signal carried on the first input line is set as 0 so that the second output line and the first output line have the same output.

16 Claims, 6 Drawing Sheets

| x | y | z | x | y | xy⊕z |
|---|---|---|---|---|------|
| 0 | 0 | 0 | 0 | 0 | 0 |
| 0 | 0 | 1 | 0 | 0 | 1 |
| 0 | 1 | 0 | 0 | 1 | 0 |
| 0 | 1 | 1 | 0 | 1 | 1 |
| 1 | 0 | 0 | 1 | 0 | 0 |
| 1 | 0 | 1 | 1 | 0 | 1 |
| 1 | 1 | 0 | 1 | 1 | 1 |
| 1 | 1 | 1 | 1 | 1 | 0 |

| x | y | z | x | y⊕xy⊕xz | z⊕xy⊕xz |
|---|---|---|---|---------|---------|
| 0 | 0 | 0 | 0 | 0 | 0 |
| 0 | 0 | 1 | 0 | 0 | 1 |
| 0 | 1 | 0 | 0 | 1 | 0 |
| 0 | 1 | 1 | 0 | 1 | 1 |
| 1 | 0 | 0 | 1 | 0 | 0 |
| 1 | 0 | 1 | 1 | 1 | 0 |
| 1 | 1 | 0 | 1 | 0 | 1 |
| 1 | 1 | 1 | 1 | 1 | 1 |

| x | y | x | x⊕y |
|---|---|---|-----|
| 0 | 0 | 0 | 0 |
| 0 | 1 | 0 | 1 |
| 1 | 0 | 1 | 1 |
| 1 | 1 | 1 | 0 |

| clk | D | $Q_n$ | clk' | D' | $Q_{n+1}$ |
|---|---|---|---|---|---|
| 0 | 0 | 0 | 0 | 0 | 0 |
| 0 | 0 | 1 | 0 | 0 | 1 |
| 0 | 1 | 0 | 0 | 1 | 0 |
| 0 | 1 | 1 | 0 | 1 | 1 |
| 1 | 0 | 0 | 1 | 0 | 0 |
| 1 | 0 | 1 | 1 | 0 | 0 |
| 1 | 1 | 0 | 1 | 1 | 1 |
| 1 | 1 | 1 | 1 | 1 | 1 |

$C' = C$
$Q_{n+1} = DC \oplus Q_n C$

REVERSIBLE SEQUENTIAL ELEMENT AND REVERSIBLE SEQUENTIAL CIRCUIT THEREOF

BACKGROUND OF THE INVENTION

1. Field of the Invention

The present invention relates to a reversible sequential element and a reversible sequential circuit, and more particularly to a reversible sequential element configured by reversible gates and a reversible sequential circuit configured by the reversible sequential elements.

2. Description of the Related Art

Reversible computing does not result in information loss during the computation process. Thus, it naturally takes care of heating generated due to information loss. Zero energy dissipation would be possible only if the gates in a network are all reversible. As a result, reversibility will become an essential property in future circuit design. Reversible logic has been applied to various future technologies, such as ultra-low-power CMOS design, optical computing, quantum computing and nanotechnology. These technologies increasingly employ reversible logic gates to reduce power computation.

However, the conventional logic gates are almost irreversible. Among the commonly used gates, only NOT gate is reversible. AND gate and OR gate are irreversible because they cannot satisfy the condition of one-to-one and onto mapping between the inputs and outputs of a logic gate. One way to make the AND function reversible is to add one input and two outputs, as shown in FIG. 1(a). These additional input and outputs for reversibility are called garbage bits. The AND function can be obtained in the third output column xy□z (□ representing an XOR gate) of FIG. 1(a), when setting z=0. The truth table of AND function is shown in bold.

This whole truth table is equivalent to the truth table of 3-bit Toffoli gate, and its symbol is shown in FIG. 1(b). The third output column xy□z means that the output is z̄ when x=y=1, and otherwise the output is z. This gate can be used to realize a 2-input reversible AND function by setting z as a constant 0, as mentioned.

Fredkin gate is a reversible gate as well and is also called controlled SWAP gate. FIG. 2(a) is the symbol of Fredkin gate and FIG. 2(b) is its truth table. Its behavior can be described as follows: if the control bit x is set to 1, the outputs of y and z are swapped, otherwise they remain unchanged.

A restriction on reversible logic synthesis has to be followed: the fanout count of a signal net must equal one so that a duplication is necessary if two copies of one signal are needed. This restriction is due to the fact that fanout structure itself is not reversible. For fanout, the number of input signals is one, but there are two or more output signals. Therefore, for this restriction, a 2-bit Toffoli gate is utilized to duplicate a signal. The symbol of a 2-bit Toffoli gate and its truth table are shown in FIGS. 3(a) and 3(b), respectively. The function of the second output column is x□y. If y is set as a constant 0, a copy of input variable x will be obtained in the second output, which is shown in bold. Therefore, the fanout structure in a conventional network can be implemented in this way.

There are two objectives in reversible circuit synthesis:
1. Minimize the number of gates: the number of gates gives a simple estimation of the implementation cost of a reversible circuit.
2. Minimize the number of garbage outputs: we need extra implementation cost (area and power) for those garbage outputs in reversible circuits. Minimizing the number of garbage outputs leads to minimizing the chip area and power consumption of a reversible circuit.

However, the synthesis result of a traditional D latch is not good when the conventional direct transformation method is used to implement a reversible D latch. This is because the D latch is built by many irreversible gates; using the direct transformation method to construct a reversible D latch will require a large number of gates and garbage outputs.

SUMMARY OF THE INVENTION

An objective of the present invention is to provide a reversible sequential element built by a minimum number of gates and a reversible sequential circuit built by the reversible sequential elements. The implementation cost of each of the reversible sequential element and reversible sequential circuit is substantially reduced.

Another objective of the present invention is to provide a reversible sequential element with a minimum garbage outputs and a reversible sequential circuit built by the reversible sequential elements. Accordingly, the chip area and power consumption of each of the reversible sequential element and reversible sequential circuit are also minimized.

In order to achieve the objective, the present invention discloses a reversible sequential element comprising a first logic gate and a second logic gate. The first logic gate includes a first input terminal, a second input terminal, a third input terminal, a first output terminal, a second output terminal and a third output terminal. The second logic gate includes a first input line, a second input line, a first output line and a second output line. Apparently, the terminals are used to designate the inputs and outputs of the first logic gate and the lines are used to designate the inputs and outputs of the second logic gate. The first input terminal for carrying an input signal is coupled to the first output terminal. When the first input terminal is set to a first state, the second input terminal is coupled to the third output terminal and the third input terminal is coupled to the second output terminal; otherwise, the second input terminal is coupled to the second output terminal and the third input terminal is coupled to the third output terminal. The third output terminal, second input line and second output line are coupled to each other. The input signal carried on the first input line is set as a constant level so that the second output line and the first output line have the same output. Furthermore, the first output line is fed back to the third input terminal.

The present invention further discloses a reversible sequential circuit comprising two aforesaid reversible sequential elements that are respectively named as a first reversible sequential element and a second reversible sequential element. The second output line of the first reversible sequential element is connected to the second input terminal of the second reversible sequential element. The first output terminal of the first reversible sequential element is connected to the first input terminal of the second reversible sequential element through an inverter.

BRIEF DESCRIPTION OF THE DRAWINGS

The invention will be described according to the appended drawings in which.

PREFERRED EMBODIMENT OF THE PRESENT INVENTION

Figures 1A, 1B:
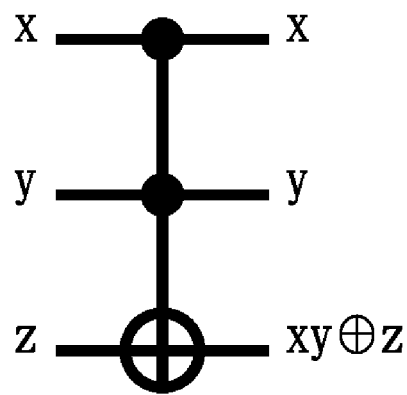
FIG. 1(a) is the truth table of a 3-bit Toffoli gate.
FIG. 1(b) is the symbol of a 3-bit Toffoli gate.
Figures 2A, 2B:
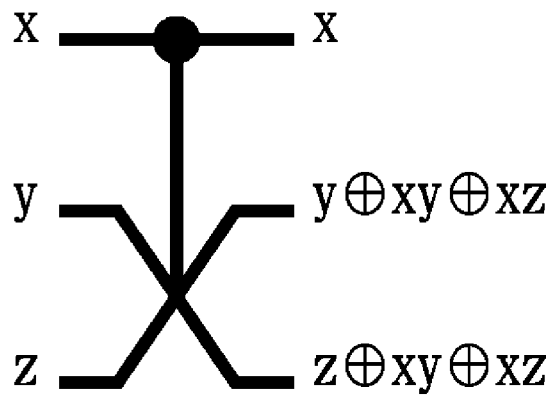
FIG. 2(a) is the symbol of a Fredkin gate.
FIG. 2(b) is the truth table of a Fredkin gate.
Figures 3A, 3B:
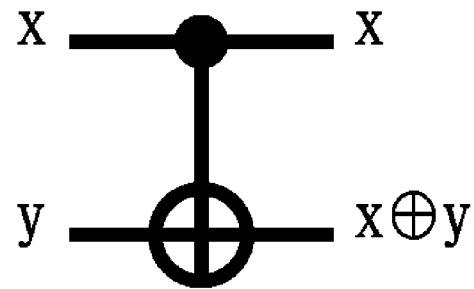
FIG. 3(a) is the symbol of a 2-bit Toffoli gate.
FIG. 3(b) is the truth table of a 2-bit Toffoli gate.
Figures 4A, 4B:
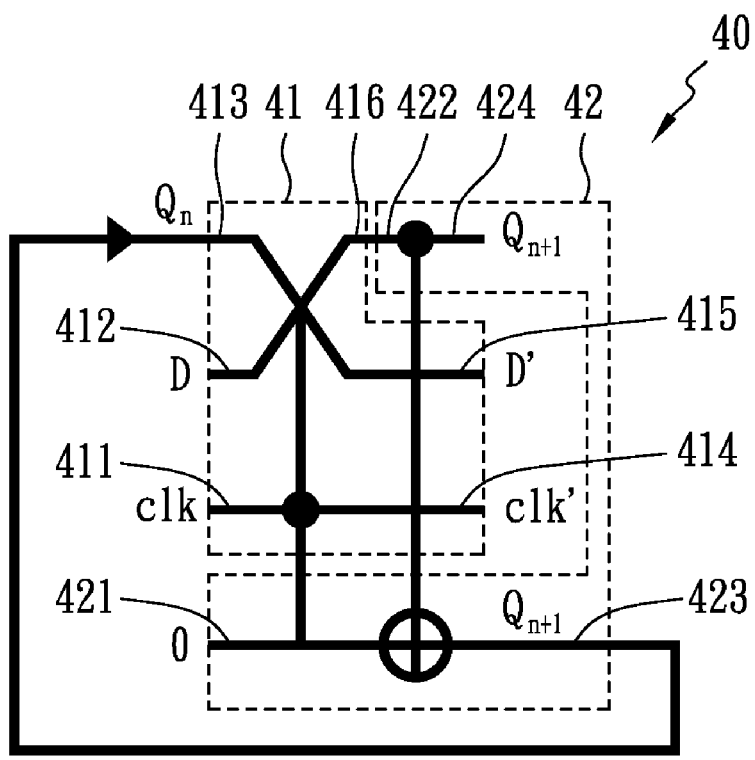
FIG. 4(a) is the augmented truth table of a D latch in accordance with the present invention.
FIG. 4(b) is the configuration of a D latch in accordance with the present invention.

FIG. 4(a) is the augmented truth table of a D latch in accordance with the present invention. Regarding the present embodiment, a truth table extension method is used to construct the novel design of the D latch. Unlike the direct transformation method, those irreversible gates are not directly replaced with the reversible ones within a sequential element. Alternatively, the original irreversible truth table of a sequential D latch is extended to an augmented reversible one. The first output clk' and second output D' are two garbage outputs that make the original D latch reversible, as shown in FIG. 4(a). The minimum number of garbage outputs required for reversibility is $\lceil \log(q) \rceil$, where q is the maximum number of times an output pattern is repeated in the truth table. In this embodiment, 0 and 1 are repeated four times in the output column $Q_{n+1}$ so that $\lceil \log(4) \rceil$ is equal to 2. Accordingly, the additional outputs clk' and D' make the table reversible. Compared with the truth table in FIG. 2(b), the augmented truth table is identical. This means we only need one Fredkin gate to implement a reversible D latch. Apparently, the values of the present truth table are assigned in different ways, so the design may be different.

After synthesizing this augmented reversible function, the fanout problem is incurred and should be resolved. The input Q in the next state comes from the current output $Q_{n+1}$. Thus, an additional $Q_{n+1}$ is needed for feedback. Accordingly, a 2-bit Toffoli gate is used to duplicate the output variable $Q_{n+1}$. The complete implementation of the reversible D latch 40 is shown in FIG. 4(b).

The reversible D latch 40 comprises a Fredkin gate 41 and a 2-bit Toffoli gate 42. The Fredkin gate 41 includes a first input terminal clk 411 for carrying a clock signal, a second input terminal D 412 for carrying a data input signal, a third input terminal $Q_n$ 413 for carrying another data input signal, a first output terminal clk' 414, a second output terminal D' 415 and a third output terminal 416. The 2-bit Toffoli gate 42 includes a first input line 421, a second input line 422, a first output line $Q_{n+1}$ 423 and a second output line $Q_{n+1}$ 424. Apparently, we use the terminals to designate the inputs and outputs of the Fredkin gate 41 and use the lines to designate the inputs and outputs of the 2-bit Toffoli gate 42. The first input terminal clk 411 is coupled to the first output terminal clk' 414. When the first input terminal clk 411 is set to a first state such as 1, the second input terminal D 412 is coupled to the third output terminal 416 and the third input terminal $Q_n$ 413 is coupled to the second output terminal D' 415; otherwise, when the first input terminal clk 411 is set to a second state such as 0, the second input terminal D 412 is coupled to the second output terminal D' 415 and the third input terminal $Q_n$ 413 is coupled to the third output terminal 416. The third output terminal 416, second input line 422 and second output line $Q_{n+1}$ 424 are coupled to each other. The input signal carried on the first input line 421 is set as 0 so that the second output line $Q_{n+1}$ 424 and the first output line $Q_{n+1}$ 423 have the same output $Q_{n+1}$. In this embodiment, the input signal carried on the first input line 421 is set to 0 as a constant level. If an inverter or an equivalent circuit is added to the first input line 421, the input signal would be set to 1 as a constant level. Furthermore, the first output line $Q_{n+1}$ 424 is fed back to the third input terminal $Q_n$ 413.

Figure 4C:
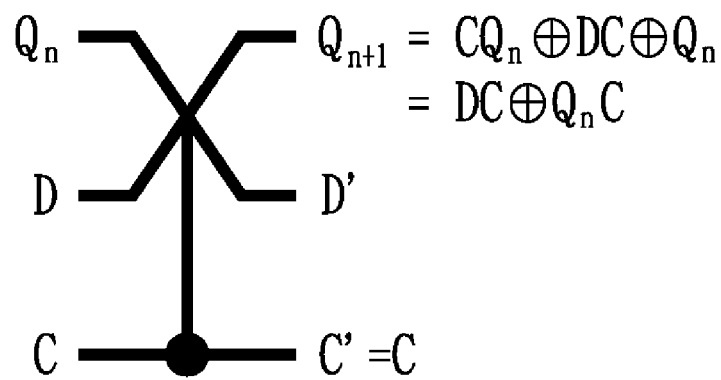
FIG. 4(c) shows the functional verification on the D latch in accordance with the present invention.

Whether the design of the reversible D latch 40 exactly implements the behavior of a D latch would be verified. The leftmost part of the symbol in FIG. 4(c) shows the Boolean functions obtained from the augmented truth table of D latch in FIG. 4(a). To simplify the expression of Boolean equations, the symbol "C" is used to represent input variable clk. The rightmost part of the symbol in FIG. 4(c) shows the functions of implemented reversible D latch. There two expressions are identical, and therefore the functionality of the reversible D latch is correct.

Figures 5A, 5B:
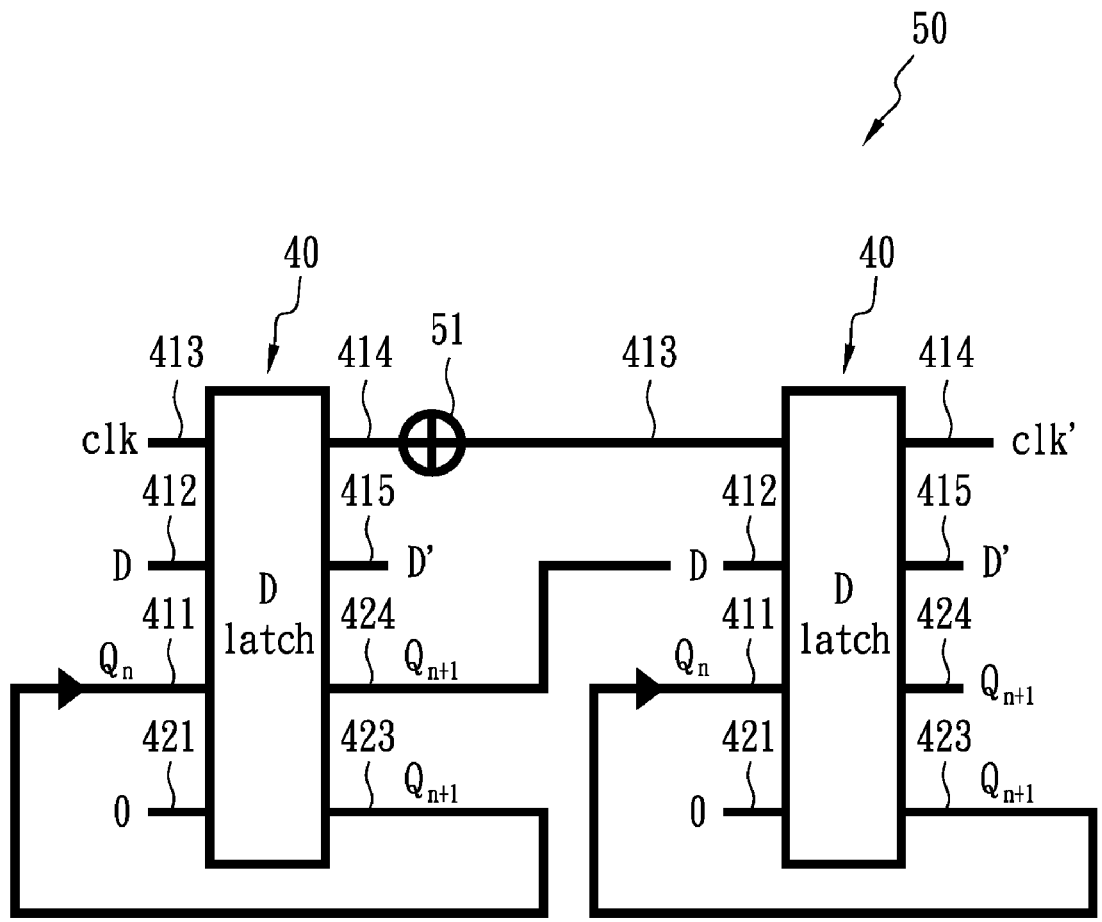
FIG. 5(a) is the truth table of a D flip-flop in accordance with the present invention.
FIG. 5(b) is the configuration of a D flip-flop in accordance with the present invention.

A flip-flop is an edge-triggered sequential element while a latch is a level-sensitive sequential element. A traditional D flip-flop consists of two D latches and one inverter. The first D latch is called the master and the second one is called the slave. Since a reversible D latch has been built, as shown in FIG. 4(b), a reversible D flip-flop can be constructed directly by replacing the D latch and inverter with its reversible versions. The behavior and structure of a reversible D flip-flop 50 are shown in FIG. 5(a) and FIG. 5(b). The D flip-flop design can be traced and compared with its function in the truth table in FIG. 5(a). The behavior of implemented D flip-flop is the same as that of the truth table.

The D flip-flop 50 comprises two reversible D latches 40. The second output line $Q_{n+1}$ 424 of the left D latch 40 is connected to the second input terminal D 412 of the right D latch 40. The first output terminal 414 of the left D latch 40 is connected to the first input terminal 413 of the right D latch 40 through an inverter gate 51 replacing an inverter.

The aforementioned descriptions of the present invention are intended to be illustrative only. Numerous alternative methods may be devised by persons skilled in the art without departing from the scope of the following claims.

What is claimed is:

1. A reversible sequential element, comprising:
   a first logic gate including a first input terminal, a second input terminal, a third input terminal, a first output terminal, a second output terminal, and a third output terminal, wherein the first output terminal is coupled to the first input terminal, the second output terminal, and the third output terminal, wherein the second input terminal is coupled to the third output terminal and the third input terminal is coupled to the second output terminal when the first input terminal is set to a first state, and otherwise the second input terminal is coupled to the second output terminal and the third input terminal is coupled to the third output terminal; and
   a second logic gate including a first input line, a second input line, a first output line, a second output line, wherein the second output line is coupled to the third output terminal and the second input line, wherein an input signal carried on the first input line is set as a constant level so that outputs of the second output line and the first output line are identical.

2. The reversible sequential element of claim 1, wherein an output signal carried on the first output line is fed back to the third input terminal.

3. The reversible sequential element of claim 1, wherein the first logic gate is a Fredkin gate.

4. The reversible sequential element of claim 1, wherein the second logic gate is a 2-bit Toffoli gate.

5. The reversible sequential element of claim 1, wherein the second input terminal and the third output terminal have the same transition in binary levels, and the third input terminal and the second output terminal have the same transition in binary levels when the first input terminal is set to 1 as the first state.

6. The reversible sequential element of claim 1, wherein the second input terminal and the second output terminal have the same transition in binary levels and the third input terminal and the third output terminal have the same transition in binary levels when the first input terminal is set to 0 as a second state.

7. The reversible sequential element of claim 1, wherein the first input terminal carries a clock signal, the second input terminal carries a data input signal and the third input terminal carries a data input signal.

8. The reversible sequential element of claim 1, wherein the reversible sequential element acts as a reversible D latch.

9. A reversible sequential circuit, comprising two reversible sequential elements,
   each of the reversible sequential elements including:
      a first logic gate including a first input terminal, a second input terminal, a third input terminal, a first output terminal, a second output terminal, and a third output terminal, wherein the first output terminal is coupled to the first input terminal, the second output terminal, and the third output terminal, wherein the second input terminal is coupled to the third output terminal and the third input terminal is coupled to the second output terminal when the first input terminal is set to a first state, and otherwise the second input terminal is coupled to the second output terminal and the third input terminal is coupled to the third output terminal; and
      a second logic gate including a first input line, a second input line, a first output line, a second output line, wherein the second output line is coupled to the third output terminal and the second input line, wherein an input signal carried on the first input line is set as a constant level so that outputs of the second output line and the first output line are identical and an output signal carried on the first output line is fed back to the third input terminal;
   wherein the second output line of the first one of the reversible sequential elements is connected to the second input terminal of the second one of the reversible sequential elements and the first output terminal of the first reversible sequential element is connected to the first input terminal of the second reversible sequential element through an inverter.

10. The reversible sequential circuit of claim 9, wherein the first logic gate is a Fredkin gate.

11. The reversible sequential circuit of claim 9, wherein the second logic gate is a 2-bit Toffoli gate.

12. The reversible sequential circuit of claim 9, wherein the second input terminal and the third output terminal have the same transition in binary levels, and the third input terminal and the second output terminal have the same transition in binary levels when the first input terminal is set to 1 as the first state.

13. The reversible sequential circuit of claim 9, wherein the second input terminal and the second output terminal have the same transition in binary levels, and the third input terminal and the third output terminal have the same transition in binary levels when the first input terminal is set to 0 as a second state.

14. The reversible sequential circuit of claim 9, wherein the first input terminal carries a clock signal, the second input terminal carries a data input signal and the third input terminal carries a data input signal.

15. The reversible sequential circuit of claim 9, wherein the reversible sequential element acts as a reversible D latch.

16. The reversible sequential circuit of claim 9, wherein the reversible sequential circuit acts as a reversible D flip-flop.

* * * * *